United States Patent
Shieh et al.

(10) Patent No.: US 9,466,486 B2
(45) Date of Patent: Oct. 11, 2016

(54) METHOD FOR INTEGRATED CIRCUIT PATTERNING

(71) Applicant: Taiwan Semiconductor Manufacturing Company, Ltd., Hsin-Chu (TW)

(72) Inventors: Ming-Feng Shieh, Yongkang (TW); Ru-Gun Liu, Zhubei (TW); Hung-Chang Hsieh, Hsin-Chu (TW); Tien-I Bao, Dayuan Township (TW); Chung-Ju Lee, Hsinchu (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 100 days.

(21) Appl. No.: 14/014,771

(22) Filed: Aug. 30, 2013

(65) Prior Publication Data

US 2015/0064916 A1 Mar. 5, 2015

(51) Int. Cl.
| | |
|---|---|
| H01L 21/308 | (2006.01) |
| H01L 21/311 | (2006.01) |
| G03F 7/26 | (2006.01) |
| H01L 21/033 | (2006.01) |
| H01L 21/768 | (2006.01) |
| H01L 29/66 | (2006.01) |

(52) U.S. Cl.
CPC ....... *H01L 21/0337* (2013.01); *H01L 21/3086* (2013.01); *H01L 21/31144* (2013.01); *H01L 21/76816* (2013.01); *H01L 29/66795* (2013.01)

(58) Field of Classification Search
CPC .......... H01L 21/0337; H01L 21/0338; H01L 21/3086; H01L 21/3088; H01L 21/76816; H01L 29/06; G03F 7/0035
See application file for complete search history.

(56) References Cited

U.S. PATENT DOCUMENTS

| | | | |
|---|---|---|---|
| 8,012,674 B2* | 9/2011 | Fischer | H01L 21/0338 430/314 |
| 2007/0048674 A1* | 3/2007 | Wells | 430/313 |
| 2007/0049040 A1* | 3/2007 | Bai et al. | 438/712 |
| 2011/0124198 A1 | 5/2011 | Lee et al. | |
| 2012/0045901 A1* | 2/2012 | Kim | H01L 21/0337 438/703 |

FOREIGN PATENT DOCUMENTS

KR    10-2011-0058366    6/2011

OTHER PUBLICATIONS

Chia-Ping Lee, U.S. Appl. No. 13/734,231, filed Jan. 4, 2013, for "Photo Resist Trimmed Line End Space," 31 pages of text, 23 pages of drawings.
Ming-Feng Shieh, U.S. Appl. No. 13/757,137, filed Feb. 1, 2013, for "Self Aligned Patterning with Multiple Resist Layers," 15 pages of text, 7 pages of drawings.
KR, Notice of Allowance, Serial No. 10-2013-0156443, dated Sep. 10, 2015, pp. 3 (partial translation).

* cited by examiner

*Primary Examiner* — Pamela E Perkins
(74) *Attorney, Agent, or Firm* — Haynes and Boone, LLP (57) ABSTRACT

A method of forming a target pattern includes forming a first trench in a substrate with a cut mask; forming a first plurality of lines over the substrate with a first main mask, wherein the first main mask includes at least one line that overlaps the first trench and is thereby cut into at least two lines by the first trench; forming a spacer layer over the substrate and the first plurality of lines and over sidewalls of the first plurality of lines; forming a patterned material layer over the spacer layer with a second main mask thereby the patterned material layer and the spacer layer collectively define a second plurality of trenches; removing at least a portion of the spacer layer to expose the first plurality of lines; and removing the first plurality of lines thereby resulting a patterned spacer layer over the substrate.

20 Claims, 10 Drawing Sheets

METHOD FOR INTEGRATED CIRCUIT PATTERNING

BACKGROUND

When fabricating integrated circuits, various features such as metal lines are formed into and onto a semiconductor substrate. To form these features, photo-masks are used to form a pattern into a photo-resist layer. The regions where the photo-resist layer is removed expose the underlying substrate to an etching process used to form trenches where metal is subsequently placed.

As the patterns formed into photo-resist layers become increasingly dense, it becomes difficult to use a single photo-mask to form a pattern in the photo-resist layer because features within the nanometer range are smaller than the resolution of a light source to which the photo-resist layer is exposed. Thus, multiple masks may be used to form the features within a pattern. Specifically, each of the multiple masks is used to create different features within the final pattern.

When multiple masks are used to form a single pattern, it is important that the patterns in the different masks are aligned properly so that various errors may be avoided. For example, it is problematic if two adjacent features, each from a different mask, are formed too close to each other. Such errors may cause short circuits or bad circuit connections.

In some cases, a cut pattern is used in association with a main pattern to form a target pattern. The cut pattern removes features formed by the main pattern in order to achieve the desired target pattern. Using such a technique provides certain advantages to the photolithographic process. For example, it is desirable to have a large process window. The process window refers to a range of focus and exposure settings that will still produce the desired features into the photo-resist layer. A process window can be improved by keeping features within a pattern relatively uniform in density. This may involve placement of "dummy" features in or near the pattern. Dummy features are extra features that are placed in order to maintain feature density, but may not serve any function within the circuit for which the pattern is designed. To separate dummy features from real features and to create the desired pattern, a cut mask can therefore be used.

When a cut mask is used, an overlay budget and CD variation budget of the cut mask are important considerations. In some occasions, only one feature at a minimum pitch will be cut. Therefore, a very small cut feature is needed. The pattern fidelity of such a small feature is often not desirable, and the total budget for overlay and CD variation is insufficient.

Accordingly, what is needed is a method to address both the overlay error impact in multiple patterning and the overlay budget and CD variation budget of cut patterns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3a-10c are top and cross sectional views of forming the target pattern shown in FIGS. 2a and 2b according to the method of FIG. 1, in accordance with an embodiment.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
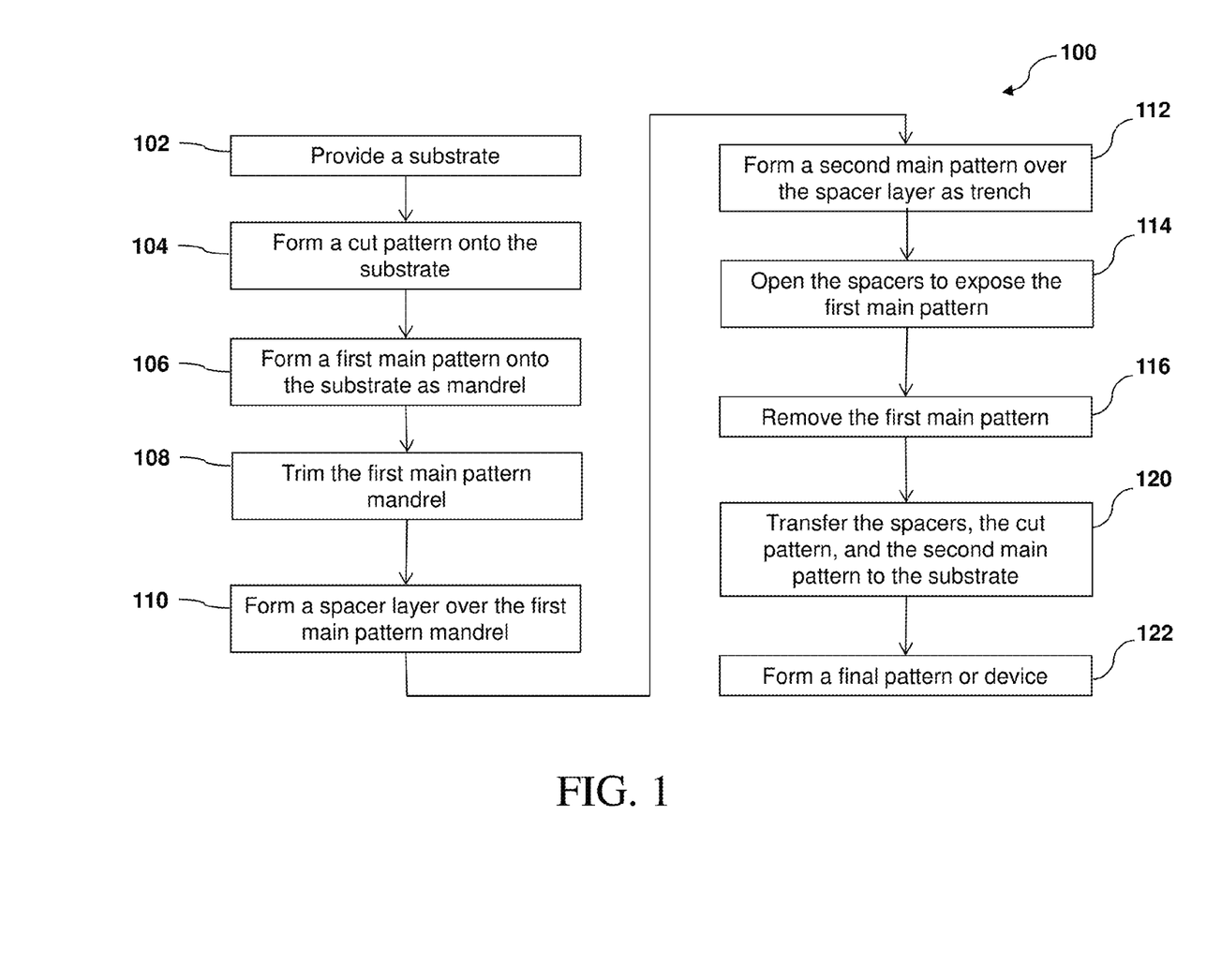
FIG. 1 is a flow chart of a method of forming a target pattern or device on a substrate for implementing one or more embodiments of the present disclosure.

Referring now to FIG. 1, a flow chart of a method 100 for forming a target pattern or device according to various aspects of the present disclosure is illustrated. Additional operations can be provided before, during, and after the method 100, and some operations described can be replaced, eliminated, or moved around for additional embodiments of the method. The method 100 will be further described below. The method 100 is an example, and is not intended to limit the present disclosure beyond what is explicitly recited in the claims.

Figure 2A:
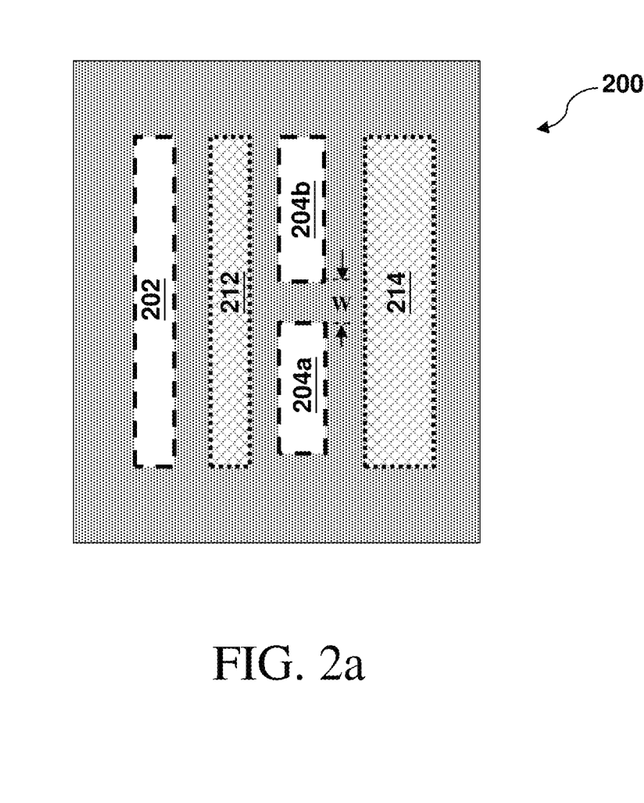
FIG. 2a shows an exemplar target pattern and FIG. 2b shows the exemplar target pattern decomposed into multiple masks.

FIG. 2a shows an exemplar target pattern 200. The target pattern 200 includes features 202, 212, 204a, 204b, and 214. The target pattern 200 may be used to form various features of an integrated circuit (IC). In an embodiment, the target pattern 200 is used to form metal lines in a multilayer interconnection structure. In another embodiment, the target pattern 200 is used to form a plurality of trenches in the semiconductor substrate for shallow trench isolation (STI) features. As mentioned above, as the density of integrated circuits increases, some features may be too close together for the resolution of a photo-mask. To overcome this issue, features of a pattern can be assigned to two or more masks. Moreover, there is a gap between the features 204a and 204b. A dimension W of the gap is a critical dimension (CD) of the target pattern 200. To improve the critical dimension, this gap is to be formed by a cut pattern.

Figure 2B:
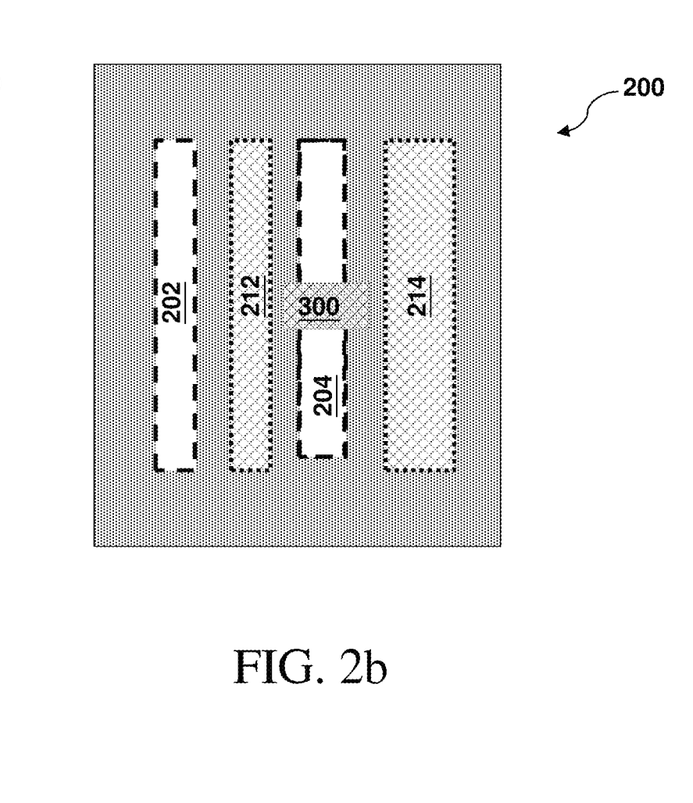

FIG. 2b shows the target pattern 200 is decomposed into three masks. A cut mask includes a cut pattern 300. A first main mask includes the feature 202 and a feature 204 which is to be cut by the cut pattern 300 thereby to form the features 204a and 204b (FIG. 2a). A second main mask includes the features 212 and 214. When patterning the features 212 and 214 assigned to the second main mask, it is important that they are aligned properly so as not to come too close to the features, 202, 204a and 204b, formed by the first main mask and the cut mask.

In the following discussion, the method 100 (FIG. 1) is described in conjunction with FIGS. 3a-10c to show how the target pattern 200 is formed using the first main mask, the second main mask and the cut mask according to various aspects of the present disclosure. In each of the FIGS. 3a-10c, the figure designated with the suffix "a" (e.g., FIG. 3a) includes a dotted line that defines cross sectional views for the figures designated with the suffix "b," "c," and so on.

Figure 3A:
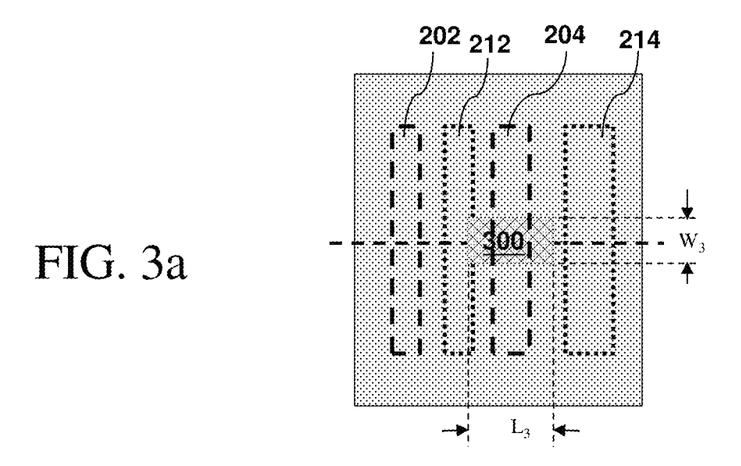

The method 100 (FIG. 1) begins at operation 102 by providing a substrate. The substrate includes one or more layers of material or composition. Referring to FIG. 3a, in the present embodiment, the substrate includes hard mask layers 330, 332, 334, 336 and 338. Each hard mask layer uses a different material or composition from another hard mask layer that is immediately over it. For example, while the hard mask layer 330 uses silicon oxide or silicon nitride (SiN), the hard mask layer 332 may use nitrogen-free anti-reflection coating (NFARC) or spin-on glass (SOG) or titanium nitride. The hard mask layers may be formed by a variety of processes. For example, the hard mask layer 330 may be formed over another substrate by a procedure such as deposition. In an embodiment, the hard mask layer 330 may include silicon oxide formed by thermal oxidation. In an embodiment, the hard mask layer 330 may include SiN formed by chemical vapor deposition (CVD). For example, the hard mask layer 330 may be formed by CVD using chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$). The hard mask layers 332, 334, 336 and 338 may be formed by a similar or a different procedure.

Figure 3B:
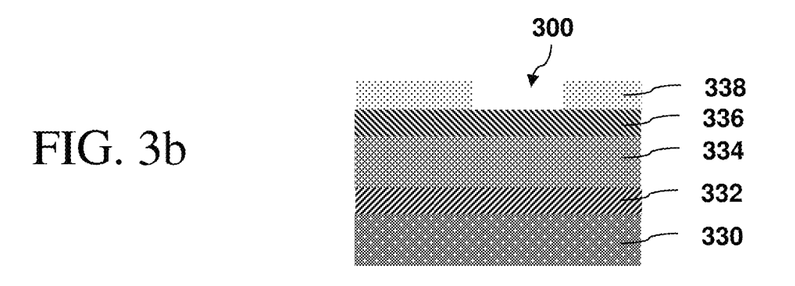

The method 100 (FIG. 1) proceeds to operation 104 by forming the cut pattern 300 over the substrate through a suitable process, such as a process including a lithography process and an etching process. Referring to FIGS. 3a and 3b, in the present embodiment, the cut pattern 300 is formed onto the hard mask layer 338 as a trench. The cut pattern 300 has a dimension $L_3$ in a direction X and a dimension $W_3$ in a direction Y. The cut pattern 300 is to cut the feature 204 to be formed in a later operation in order to form the features 204a and 204b for the target pattern 200 (FIGS. 2a and 2b). The dimension $W_3$ defines a critical dimension of the target pattern 200 (FIG. 2a).

In some cases, the features 202, 212, 204 and 214 are half-pitch apart. If the features 202, 212, 204 and 214 were assigned to one mask, the dimension $L_3$ would be limited by a space between 212 and 214, which is less than one pitch. The pattern fidelity of such a small pattern is not desirable. In the present disclosure, since only features 202 and 204 are assigned to the first main mask that is to be cut by the cut pattern 300, the dimension $L_3$ can be relatively larger.

The process of forming the cut pattern 300 onto the hard mask layer 338 includes a lithography process and an etching process. In an embodiment, a resist layer, patterned with the cut pattern 300, is formed over the hard mask layer 338 using a lithography process, such as resist coating, soft baking, exposing, post-exposure baking (PEB), developing, and hard baking in one example. Then, the hard mask layer 338 is etched through the openings of the patterned resist layer, thereby forming the cut pattern 300 in the hard mask layer 338 by the etching process. The patterned resist layer is removed thereafter using a suitable process, such as wet stripping or plasma ashing. In one example, the etching process includes applying a dry (or plasma) etch to remove the hard mask layer 338 within the openings of the patterned resist layer. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 4A:
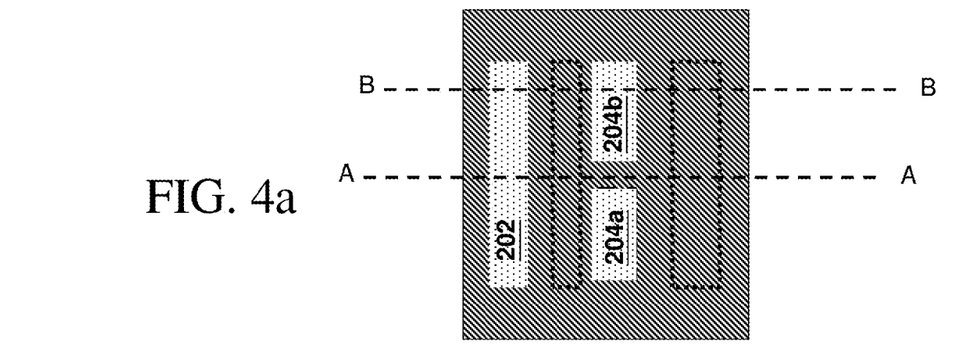
Figures 4B, 4C:
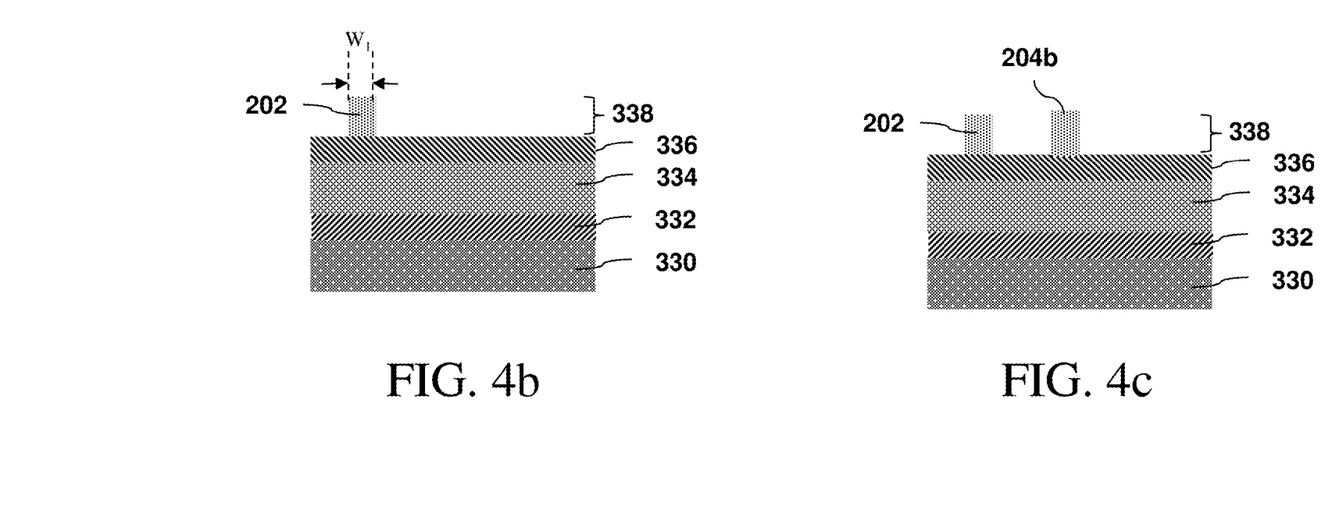

The method 100 (FIG. 1) proceeds to operation 106 by forming mandrel lines onto the substrate using the first main mask. Referring to FIGS. 4a, 4b and 4c, FIG. 4b is a cross sectional view of the substrate taken along an A-A line of the FIG. 4a, while FIG. 4c is a cross sectional view of the substrate taken along a B-B line of the FIG. 4a. In the present embodiment, the features 202 and 204 (FIG. 2b) are formed onto the hard mask layer 338 as mandrel lines with a width $W_1$. Since the feature 204 overlaps with the cut pattern 300, it is cut into the features 204a and 204b. The process of forming the features 202 and 204 onto the substrate starts with forming a material layer over the hard mask layer 338 using one or more material different from the hard mask layer 338. For example, while the hard mask layer 338 uses silicon oxide or silicon nitride, the material layer may use bottom anti-reflective coating (BARC) or spin-on glass (SOG). The process further includes a lithography process and an etching process thereby forming features 202, 204a and 204b as mandrel lines onto the hard mask layer 338. In an embodiment, a resist layer, patterned with the first main mask, is formed on the material layer using a lithography process. Then, the material layer and the hard mask layer 338 are etched through the openings of the patterned resist layer, forming a plurality of lines in the hard mask layer 338 by the etching process. The patterned resist layer is removed thereafter using a suitable process, such as wet stripping or plasma ashing. The material layer is removed thereafter using a suitable process, such as an etching process tuned to selectively remove the material layer while the hard mask layer 338 remains.

In some cases, the features in the first main mask may be larger than the corresponding features of the target pattern 200 (FIG. 2a). The present disclosure further includes operations such as trimming to fine tune dimensions of various features in order to form the target pattern 200. By so doing, the present disclosure improves the lithography patterning process window.

Figure 5A:
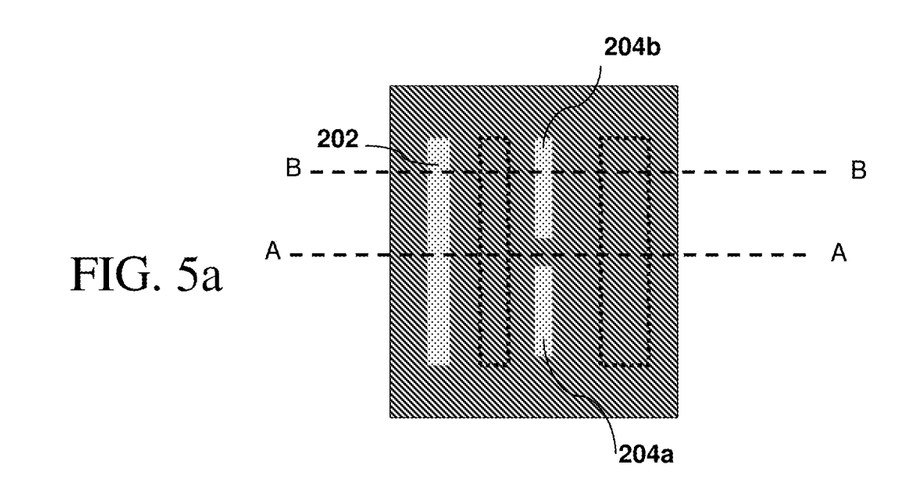
Figure 5B:
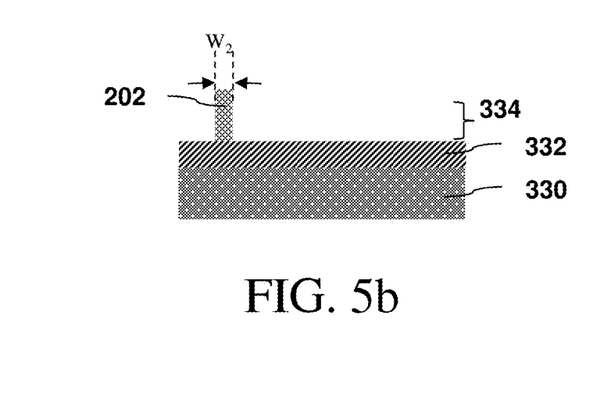
Figure 5C:
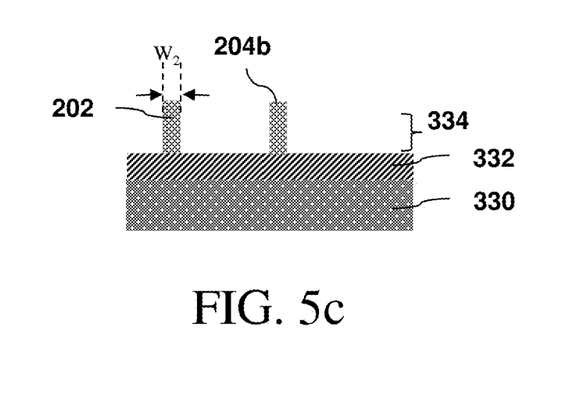

The method 100 (FIG. 1) proceeds to operation 108 by trimming the features 202, 204a and 204b for the target pattern. Referring to FIGS. 5a, 5b and 5c, FIG. 5b is a cross sectional view of the substrate taken along an A-A line of the FIG. 5*a*, while FIG. 5*c* is a cross sectional view of the substrate taken along a B-B line of the FIG. 5*a*. The hard mask layer 334 is etched with the patterned hard mask layer 338 as the etch mask and the hard mask layers, 338 and 336, are thereafter removed, forming the features, 202, 204*a* and 204*b*, onto the hard mask layer 334 as mandrel lines. The mandrel lines, 202, 204*a* and 204*b*, are further trimmed to have a width $W_2$, where $W_2$ is less than $W_1$, via a wet or dry etching process, such as an anisotropic plasma etch.

Figure 6A:
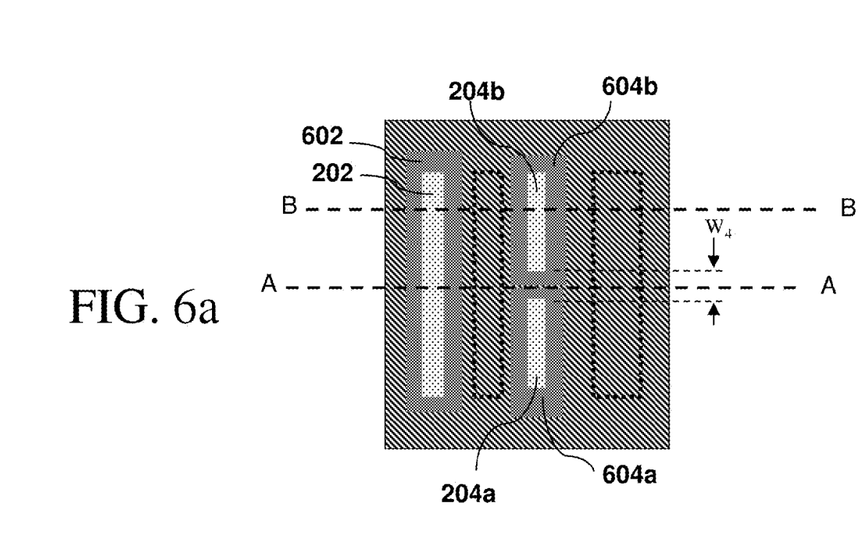
Figure 6B:
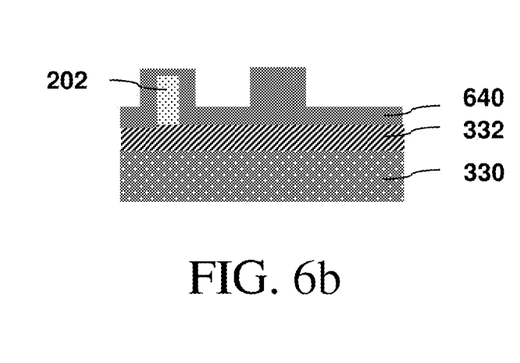
Figure 6C:
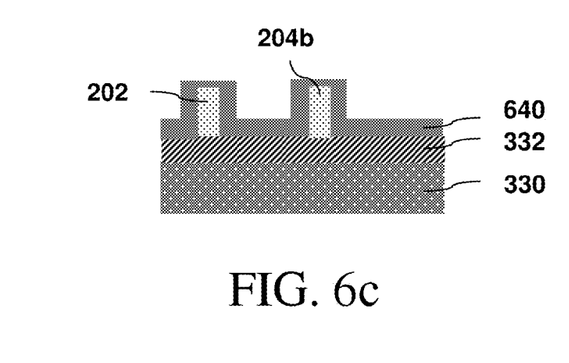

The method 100 (FIG. 1) proceeds to operation 110 by forming a spacer layer over the hard mask layer 334 and over and around the mandrel lines 202, 204*a* and 204*b*. Referring to FIGS. 6*a*, 6*b* and 6*c*, FIG. 6*b* is a cross sectional view of the substrate taken along an A-A line of the FIG. 6*a*, while FIG. 6*c* is a cross sectional view of the substrate taken along a B-B line of the FIG. 6*a*. A spacer layer 640 is formed over the hard mask layer 332. The spacer layer 640 includes one or more material different from the hard mask layers, 332 and 334. In an embodiment, the spacer layer may include a dielectric material, such as titanium nitride, silicon nitride, or titanium oxide. The spacer layer may be formed by a suitable process, such as a deposition process. For example, the deposition process includes a chemical vapor deposition (CVD) process or a physical vapor deposition (PVD) process. Spacer features, 602, 604*a* and 604*b*, formed on sidewalls of the mandrel lines, 202, 204*a* and 204*b*, have a thickness. When the thickness is greater than half of a space between two ends of mandrel lines, the spacer features will merge. As shown in FIG. 6*a*, the spacer features 604*a* and 604*b* merge because a combined thickness of the two spacer features is greater than a gap $W_4$ between the two mandrel lines 204*a* and 204*b*.

The method 100 (FIG. 1) proceeds to operation 112 by forming trenches over the spacer layer with the second main mask. This operation includes a variety of processes such as a deposition and an etching process, a lithography process and another etching process. It is illustrated in conjunction with FIGS. 7*a*-9*b*.

Figure 7A:
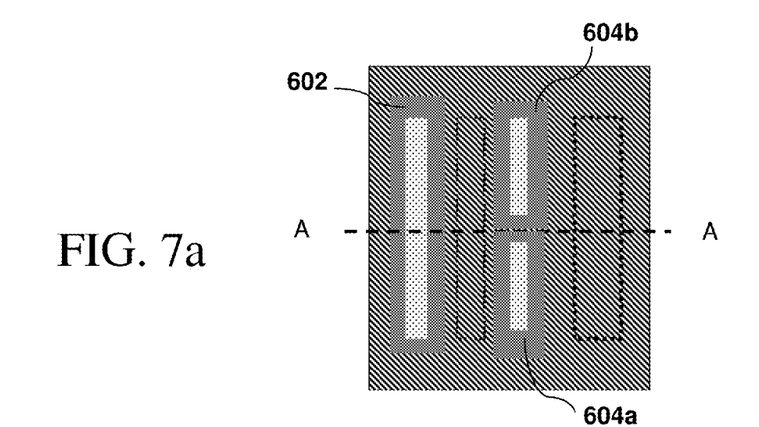
Figure 7B:
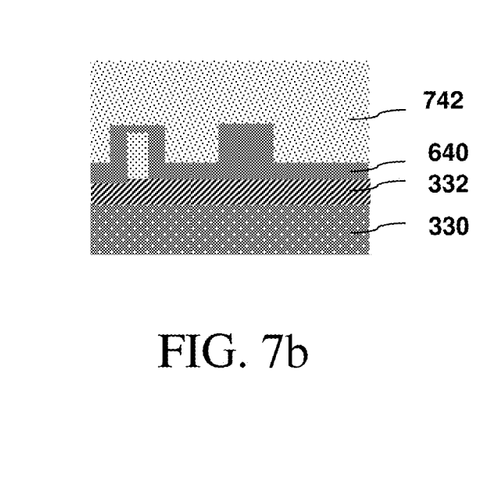
Figure 7C:
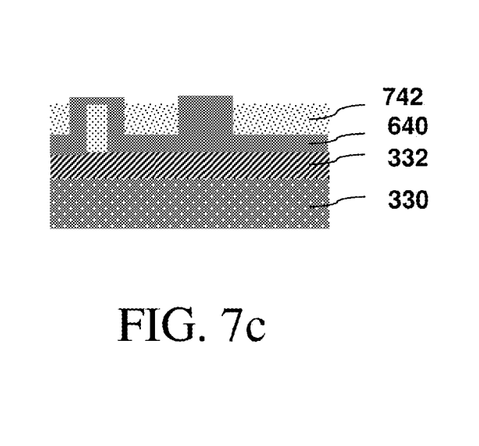

Referring to FIGS. 7*a*-7*c*, FIGS. 7*b* and 7*c* are cross sectional views of the substrate taken along an A-A line of the FIG. 7*a*. A material layer 742 is formed on the substrate and over the spacer layer 640. In an embodiment, the material layer 742 is deposited over the spacer layer (FIG. 7*b*) and is then partially removed (FIG. 7*c*) such that top surfaces of spacer features, 602, 604*a* and 604*b*, are exposed by a procedure, such as chemical mechanical polishing (CMP) or etch back. In an embodiment, the material layer 742 uses bottom anti-reflective coating (BARC) or spin-on glass (SOG).

Figure 8A:
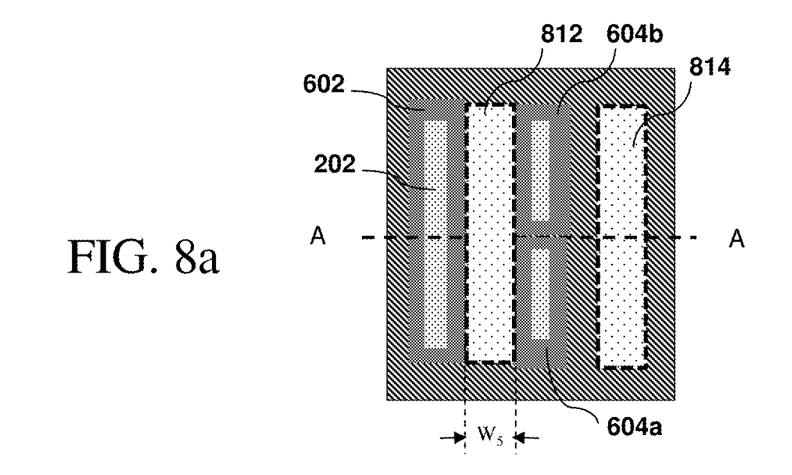
Figure 8B:
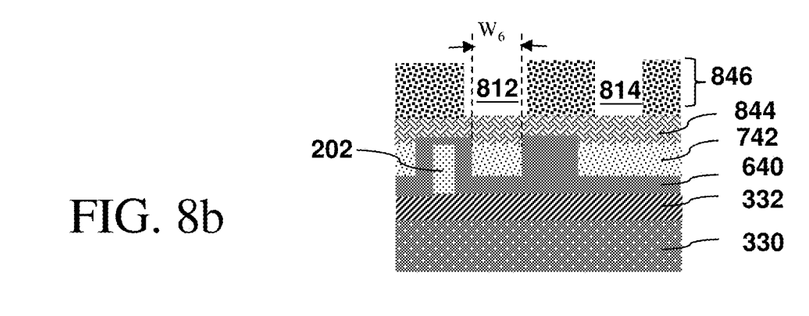

Referring to FIG. 8*a* and FIG. 8*b* which is a cross sectional view of the substrate taken along an A-A line of the FIG. 8*a*, a material layer 844 is deposited over the spacer layer 640 and the material layer 742. A resist layer 846, patterned with the second main mask as trenches, is formed on the material layer 844 using a lithography process. Two trenches 812 and 814 of the second main mask correspond to the features 212 and 214 of the target pattern (FIG. 2*a*). As is illustrated in FIG. 8*b*, $W_5$ denotes a width of the trench 812, $W_6$ denotes a space between the spacer features 602 and 604*a/b*, and $W_5$ may be less than, equal to, or greater than $W_6$. In another words, the trench 812 of the patterned resist layer 846 may overlap the spacer features, 602, 604*a* and 604*b*, and may overlap even the feature 202 of the patterned hard mask layer 334 (FIG. 5*b*). The overlap will not adversely affect the intended final pattern due to a selective etching process in a later operation. Thus, a larger alignment error between the first and the second main masks that form the target pattern 200 (FIG. 2*b*) may be tolerated. The material layer 844 may include one or more material layers. For example, the material layer 844 may include a bottom material layer and a top material layer where the bottom material layer may be a Bottom Anti-Reflective Coating (BARC) layer while the top material layer may be made of silicon and is used as a hard mask for the lithography process.

Figure 9A:
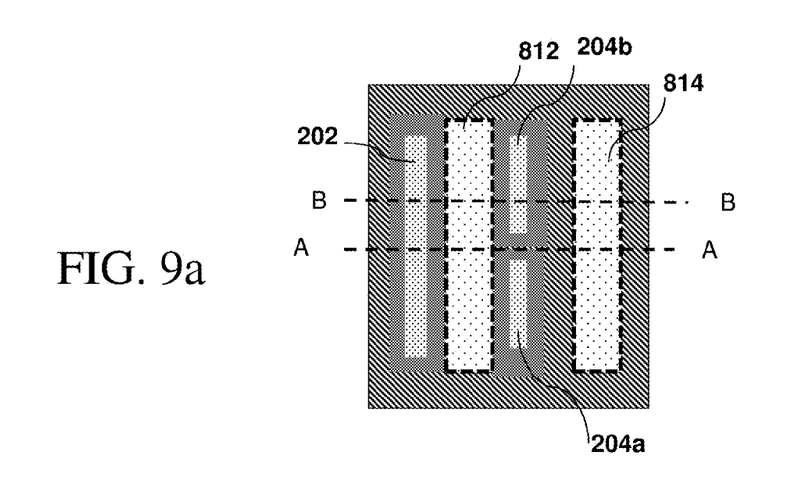
Figure 9B:
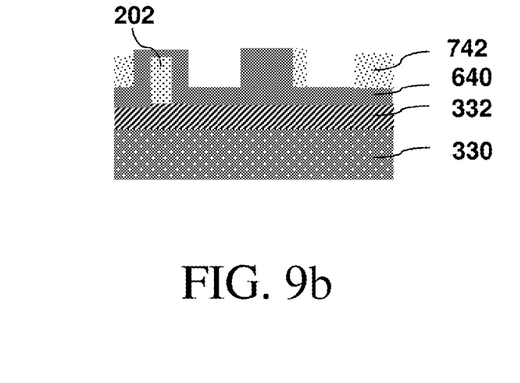

The material layer 844 is etched with the patterned resist layer 846 of FIG. 8*b* as an etch mask. The patterned resist layer 846 is removed thereafter using a suitable process, such as wet stripping or plasma ashing. Referring to FIG. 9*a* and FIG. 9*b* which is a cross sectional view of the substrate taken along an A-A line of the FIG. 9*a*, the material layer 742 is etched with the patterned material layer 844 as an etch mask using a suitable process, such as an etching process tuned to selectively remove the material layer 742 while the spacer layer 640 remains. The material layer 844 is removed thereafter using a suitable process, such as an etching process tuned to selectively remove the material layer 844 while the layers 742 and 640 remain (FIG. 9*b*).

Figure 9C:
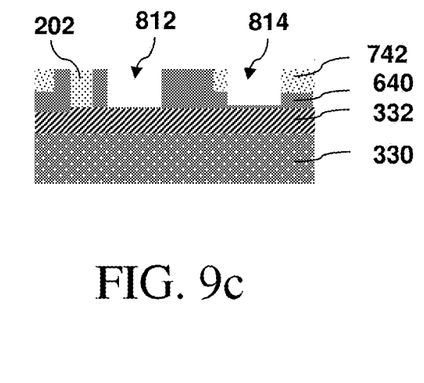
Figure 9D:
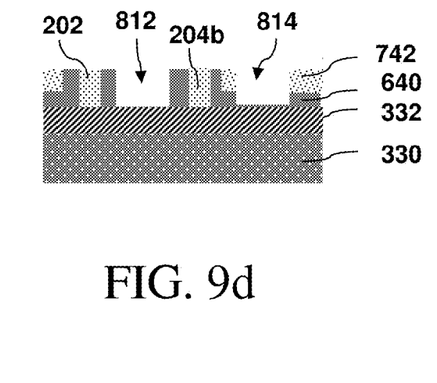

The method 100 (FIG. 1) proceeds to operation 114 by etching the spacer layer 640 such that top surfaces of the mandrel lines, 202, 204*a* and 204*b*, are exposed. Referring to FIG. 9*c* which is a cross sectional view of the substrate taken along the A-A line of the FIG. 9*a*, the mandrel line 202 is exposed by this etching process. Referring to FIG. 9*d* which is a cross sectional view of the substrate taken along a B-B line of the FIG. 9*a*, the mandrel lines, 204*a* (not shown) and 204*b*, are similarly exposed. Spacer material disposed over the hard mask layer 332 is also removed at the bottom of the trenches 812 and 814. In an embodiment, the process of etching the spacer layer includes an anisotropic etch such as plasma etch.

Figure 10A:
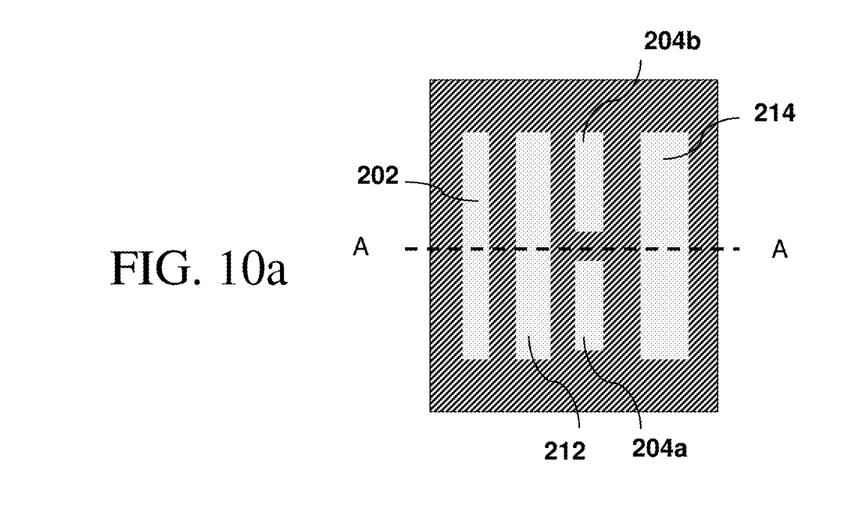
Figure 10B:
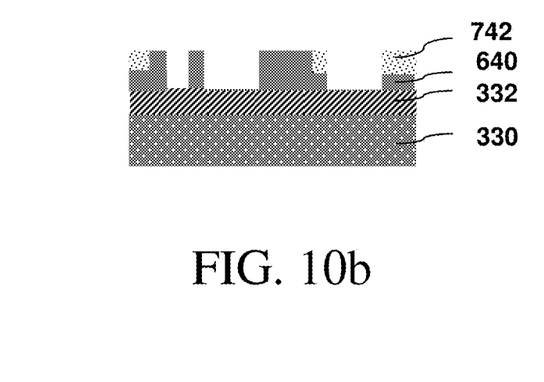

The method 100 (FIG. 1) proceeds to operation 116 by removing the mandrel lines, 202, 204*a* and 204*b*, of the first main pattern. FIG. 10*b*, which is a cross sectional view of the substrate taken along an A-A line of the FIG. 10*a*, shows that mandrel lines 202, 204*a* and 204*b* (FIG. 9*a*) are removed by a suitable process such as plasma ashing. As a result, the spacer layer 640 and the material layer 742 are patterned with a plurality of openings and the plurality of openings corresponds to the target pattern 200 (FIG. 2*a*).

Figure 10C:
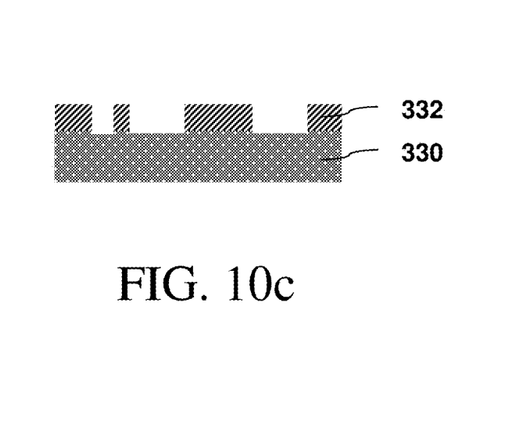

The method 100 (FIG. 1) proceeds to operation 120 by transferring the pattern from the spacer layer 640 and the material layer 742 to the hard mask layer 332. The spacer layer 640 and the material layer 742 are thereafter removed. Referring to FIG. 10*c* which is a cross sectional view of the substrate taken along the A-A line of the FIG. 10*a*, a final pattern is formed in the hard mask layer 332 as trenches, 202, 212, 204*a*, 204*b*, and 214.

The method 100 (FIG. 1) proceeds to operation 122 to form a final pattern or device with the patterned hard mask layer 332. In an embodiment, a target pattern is to be formed as metal lines in a multilayer interconnection structure. For example, the metal lines may be formed in an inter-layer dielectric (ILD) layer. In such a case, the operation 122 forms a plurality of trenches in the ILD layer using the patterned hard mask layer 332; fills the trenches with a conductive material, such as a metal; and polishes the conductive material using a process such as chemical mechanical polishing to expose the patterned ILD layer, thereby forming the metal lines in the ILD layer.

In another embodiment, the operation 122 forms fin field effect transistor (FinFET) structures on a semiconductor substrate using the patterned hard mask layer 332. In this embodiment, the operation 122 forms a plurality of trenches in the semiconductor substrate. Shallow trench isolation (STI) features are further formed in the trenches by a procedure that includes deposition to fill the trenches with a dielectric material and polishing (such as CMP) to remove excessive dielectric material and to planarize the top surface of the semiconductor substrate. Thereafter, a selective etch process is applied to the dielectric material to recess the STI features, thereby forming fin-like active regions.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a method of forming a target pattern for an integrated circuit (IC). The method includes forming a first trench in a substrate with a cut mask; forming a first plurality of lines over the substrate with a first main mask, wherein the first main mask includes at least one line that overlaps the first trench and is thereby cut into at least two lines by the first trench; forming a spacer layer over the substrate and the first plurality of lines and over sidewalls of the first plurality of lines; forming a patterned material layer over the spacer layer with a second main mask thereby the patterned material layer and the spacer layer collectively define a second plurality of trenches; removing at least a portion of the spacer layer to expose the first plurality of lines; and removing the first plurality of lines thereby resulting a patterned spacer layer over the substrate.

In another exemplary aspect, the present disclosure is directed to a method of forming a target pattern for an integrated circuit (IC). The method includes decomposing the target pattern to at least a cut mask, a first main mask and a second main mask, wherein the cut mask is to remove at least a portion of features to be formed with the first main mask; patterning a substrate with the cut mask; patterning the substrate with the first main mask thereby forming a first plurality of features; forming a spacer layer over the substrate and over sidewalls of the first plurality of features; forming a material layer over the spacer layer; etching back the material layer to expose the spacer layer; patterning the material layer with the second main mask; removing at least a portion of the spacer layer to expose the first plurality of features and to expose the substrate; and removing the first plurality of features.

In yet another exemplary aspect, the present disclosure is directed to a method of forming a pattern on a substrate having a plurality of hard mask layers. The method includes forming a trench in a first hard mask layer; forming lines in the first hard mask layer; depositing a first material to a first thickness over the substrate, over the lines and the trench and onto sidewalls of the lines and the trench; depositing a second material over the first material; patterning the first and second materials to form trenches that do not overlap the lines; and removing the lines.

What is claimed is:

1. A method of forming a target pattern for an integrated circuit, the method comprising:
    forming a first trench in a substrate with a cut mask;
    forming a first plurality of lines over the substrate with a first main mask, wherein the first plurality of lines includes at least one line that overlaps the first trench and is thereby cut into at least two lines by the first trench and further includes at least one line that is uncut;
    forming a spacer layer over the substrate and the first plurality of lines and over sidewalls of the first plurality of lines;
    forming a patterned material layer over the spacer layer with a second main mask thereby the patterned material layer and the spacer layer collectively define a second plurality of trenches;
    removing at least a portion of the spacer layer to expose the first plurality of lines; and
    removing the first plurality of lines thereby providing a patterned spacer layer over the substrate.

2. The method of claim 1, further comprising:
    trimming the first plurality of lines before the forming the spacer layer.

3. The method of claim 2, wherein the trimming the first plurality of lines includes etching sidewalls of the first plurality of lines.

4. The method of claim 1, further comprising:
    etching the substrate using the patterned spacer layer as an etch mask; and
    after etching, removing the spacer layer.

5. The method of claim 1, wherein the forming the first plurality of lines includes:
    forming a material layer over the substrate and over the first trench;
    forming a resist layer over the material layer;
    patterning the resist layer with the first main mask;
    etching the material layer using the patterned resist layer as an etch mask;
    thereafter removing the patterned resist layer;
    etching the substrate using the patterned material layer as an etch mask; and
    after etching, removing the material layer.

6. The method of claim 1, wherein the forming the spacer layer includes deposition.

7. The method of claim 1, wherein the forming the second plurality of trenches includes:
    forming a first material layer over the spacer layer;
    etching back the first material layer thereby to expose the spacer layer;
    forming a second material layer over the first material layer and the spacer layer;
    forming a resist layer over the second material layer;
    patterning the resist layer with the second main mask;
    etching the second material layer using the patterned resist layer as an etch mask;
    thereafter removing the patterned resist layer;
    etching the first material layer using the patterned second material layer as an etch mask; and
    thereafter removing the patterned second material layer.

8. The method of claim 7, wherein the etching the first material layer includes a process selectively tuned to remove the first material layer using the patterned second material layer as an etch mask while the spacer layer remains.

9. The method of claim 1, wherein a space between two of the second plurality of trenches is defined, at least in part, by a pattern space of the second main mask and the spacer layer over the sidewalls of the first plurality of lines.

10. The method of claim 1, wherein the removing at least a portion of the spacer layer includes an anisotropic etching process.

11. The method of claim 10, wherein the anisotropic etching process includes plasma etching.

12. The method of claim 1, wherein the removing the first plurality of lines includes a plasma ashing process.

13. A method of forming a target pattern for an integrated circuit, the method comprising:
decomposing the target pattern to at least a cut mask, a first main mask and a second main mask, wherein the cut mask is to remove at least a portion of features to be formed with the first main mask;
patterning a substrate with the cut mask;
patterning the substrate with the first main mask thereby forming a first plurality of features;
forming a spacer layer over the substrate and over sidewalls of the first plurality of features;
forming a material layer over the spacer layer;
etching back the material layer to expose the spacer layer;
after the etching back, patterning the material layer with the second main mask;
removing at least a portion of the spacer layer to expose the first plurality of features and to expose the substrate; and
removing the first plurality of features.

14. The method of claim 13, wherein the patterning the material layer includes a process selectively tuned to etch the material layer while the spacer layer remains.

15. The method of claim 13, further comprising:
etching the substrate with the patterned material layer and the spacer layer as etch mask; and
after etching, removing the patterned material layer and the spacer layer.

16. The method of claim 13, wherein:
the forming the spacer layer includes a deposition process; and
the removing at least a portion of the spacer layer includes an anisotropic etching process.

17. A method comprising:
receiving a substrate, the substrate having a plurality of hard mask layers;
forming a trench in a first hard mask layer;
forming lines in the first hard mask layer with a first main mask;
depositing a first material to a first thickness over the substrate, over the lines and the trench and onto sidewalls of the lines and the trench;
depositing a second material over the first material;
etching back the second material to expose the first material;
after the etching back, patterning the first and second materials with a second main mask to form trenches extending in a direction approximately parallel to the lines; and
removing the lines.

18. The method of claim 17, further comprising, before the depositing the first material:
transferring the lines from the first hard mask layer to a second hard mask layer of the substrate; and
trimming the lines.

19. The method of claim 17, further comprising, before the removing the lines, removing at least a portion of the first and second materials to expose the lines.

20. The method of claim 17, further comprising, etching the substrate with patterns defined by openings within the first and second materials.

\* \* \* \* \*